US012661831B2

(12) United States Patent
Nomura

(10) Patent No.: US 12,661,831 B2
(45) Date of Patent: Jun. 23, 2026

(54) RESIN SEALING APPARATUS AND SEALING MOLD

(71) Applicant: Yamaha Robotics Co., Ltd., Tokyo (JP)

(72) Inventor: Yudai Nomura, Nagano (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 132 days.

(21) Appl. No.: 18/689,857

(22) PCT Filed: Jul. 21, 2022

(86) PCT No.: PCT/JP2022/028336
§ 371 (c)(1),
(2) Date: Mar. 6, 2024

(87) PCT Pub. No.: WO2023/105840
PCT Pub. Date: Jun. 15, 2023

(65) Prior Publication Data
US 2025/0222633 A1     Jul. 10, 2025

(30) Foreign Application Priority Data
Dec. 6, 2021     (JP) ................................. 2021-198034

(51) Int. Cl.
*B29C 43/36*      (2006.01)
*B29C 43/18*      (2006.01)
(Continued)

(52) U.S. Cl.
CPC .............. *B29C 43/36* (2013.01); *B29C 43/18* (2013.01); *H10P 72/0441* (2026.01);
(Continued)

(58) Field of Classification Search
CPC ... B29C 43/18; B29C 43/36; B29C 2043/182; B29C 2043/3255; B29C 2043/3602;
(Continued)

(56) References Cited

U.S. PATENT DOCUMENTS

| 7,288,440 B2 | 10/2007 | Kuratomi et al. |
| 7,445,969 B2 | 11/2008 | Kuratomi et al. |

(Continued)

FOREIGN PATENT DOCUMENTS

| CN | 1601711 | 3/2005 |
| JP | 2002151531 | 5/2002 |

(Continued)

OTHER PUBLICATIONS

"International Search Report (Form PCT/ISA/210) of PCT/JP2022/028336", mailed on Sep. 20, 2022, with English translation thereof, pp. 1-4.

(Continued)

*Primary Examiner* — Jerzi H Moreno Hernandez
(74) *Attorney, Agent, or Firm* — JCIPRNET

(57) ABSTRACT

In a sealing mold, one of an upper mold and a lower mold is provided with one workpiece holding part that holds workpieces, and the other of the upper mold and the lower mold is provided with: clampers having structures divided from each other that individually clamp the workpieces held on the one workpiece holding part; and a cavity piece capable of moving up and down in a manner unlinked with the clamper at a central position in a plan view of each of the clampers. The sealing mold includes: a clamper spring that biases the clamper toward the workpiece holding part; and a cavity piece spring that biases the cavity piece toward the workpiece holding part.

9 Claims, 6 Drawing Sheets

(51) Int. Cl.

| | | |
|---|---|---|
| *B29C 43/32* | (2006.01) | |
| *H10P 72/00* | (2026.01) | |
| *H10W 74/01* | (2026.01) | |

(52) U.S. Cl.
CPC ..... *H10W 74/016* (2026.01); *B29C 2043/182* (2013.01); *B29C 2043/3255* (2013.01); *B29C 2043/3602* (2013.01)

(58) Field of Classification Search
CPC . B29C 2043/181; H01L 21/56; H01L 21/565; H01L 21/67126
See application file for complete search history.

(56) References Cited

U.S. PATENT DOCUMENTS

| | | | | |
|---|---|---|---|---|
| 2008/0265464 | A1* | 10/2008 | D'Hooghe | D03D 15/283 |
| | | | | 264/322 |
| 2012/0247664 | A1* | 10/2012 | Kobayashi | H01L 24/75 |
| | | | | 156/308.2 |
| 2016/0151946 | A1* | 6/2016 | Taka | B29C 43/36 |
| | | | | 425/457 |
| 2019/0190361 | A1* | 6/2019 | Okudaira | H02K 15/12 |

FOREIGN PATENT DOCUMENTS

| | | | | |
|---|---|---|---|---|
| JP | 2005053143 | 3/2005 | | |
| JP | 2005088395 | 4/2005 | | |
| JP | 2016101743 | 6/2016 | | |
| JP | 2019136942 | 8/2019 | | |
| JP | 6995415 | B1 * | 1/2022 | .......... H01L 21/565 |
| TW | 201722681 | 7/2017 | | |
| TW | 201902658 | 1/2019 | | |

OTHER PUBLICATIONS

"Office Action of Taiwan Counterpart Application", issued on Feb. 2, 2023, with partial English translation thereof, pp. 1-17.

* cited by examiner

IV-IV

RESIN SEALING APPARATUS AND SEALING MOLD

CROSS-REFERENCE TO RELATED APPLICATION

This application is a 371 application of the International PCT application serial no. PCT/JP2022/028336, filed on Jul. 21, 2022, which claims the priority benefits of Japan Patent Application No. 2021-198034, filed on Dec. 6, 2021. The entirety of each of the above-mentioned patent applications is hereby incorporated by reference herein and made a part of this specification.

TECHNICAL FIELD

The present invention relates to a resin sealing apparatus and a sealing mold.

RELATED ART

An example of a resin sealing apparatus that seals a workpiece, which has electronic components mounted on a substrate, with a sealing resin (hereinafter simply referred to as a "resin") to process into a molded product includes one based on a compression molding method.

This compression molding method is a technique of performing resin sealing by an operation in which a predetermined amount of resin is supplied to a sealing region (cavity) provided in a sealing mold composed of an upper mold and a lower mold and a workpiece is arranged in the sealing region to perform clamping by the upper mold and the lower mold (see Patent Document 1: Japanese Patent Application Laid-Open No. 2019-136942). As an example, in the case of using a sealing mold with a cavity provided in the upper mold, a technique is known to supply resin collectively to the central position on the workpiece to perform molding. On the other hand, in the case of using a sealing mold with a cavity provided in the lower mold, a technique is known to supply a film covering the mold surface including the cavity and supply resin to perform molding.

RELATED ART DOCUMENT

Patent Document

Patent Document 1: Japanese Patent Application Laid-Open No. 2019-136942

SUMMARY OF INVENTION

Problem to be Solved by Invention

In the molding by the compression molding method, to improve production efficiency, research and development has been carried out on a technique (so-called "multi-row take-up molding") that holds a plurality of workpieces on one workpiece holding part in the sealing mold and performs resin sealing collectively to process into molded products.

Regarding multi-row take-up molding described above, the inventors of the present application have first examined a configuration in which the clamper that clamps a plurality of workpieces held on one workpiece holding part is set as one (i.e., integral). According to this configuration, since only one clamper (integral structure) is required for a plurality of workpieces, simplification of the apparatus structure can be achieved. However, on the other hand, even if the clamper is configured to be movable up and down, it is impossible (or difficult) to absorb thickness variation of the workpiece. As a result, issues arise such as damage to thicker workpieces, insufficient clamping force for thinner workpieces, and failure to obtain flatness of molded products due to tilting of the sealing mold. Furthermore, it is impossible (or difficult) to absorb the variation in resin amount.

In response to these issues, the inventors of the present application have examined a configuration that absorbs the variation in workpiece thickness and the variation in resin amount by including a mechanism that enables the workpiece holding part to move up and down for each workpiece. However, according to such a configuration, the following issues arise: an up-down moving mechanism (e.g., an up-down moving mechanism of a clamper) using a biasing member on one mold (e.g., the upper mold) side and an up-down moving mechanism (e.g., an up-down moving mechanism of a workpiece holding part) using a biasing member on the other mold (e.g., the lower mold) side interact with each other, the adjustment to the acting force during resin sealing, specifically, the workpiece clamping force and the molding pressure, becomes very complicated, and it takes a lot of effort and time to adjust to the optimal acting force.

Means for Solving Problems

The present invention has been made in view of the above circumstances and an objective thereof is to provide a sealing mold and a resin sealing apparatus including the sealing mold, capable of absorbing both the variation in workpiece thickness and the variation in resin amount by a simple apparatus configuration, and capable of easily and quickly performing setting of the workpiece clamping force and the molding pressure during resin sealing by adjustment to only one of the molds.

The present invention solves the above issues by means of solutions as described below as an embodiment.

A sealing mold according to the present invention is a sealing mold that includes an upper mold and a lower mold and seals a workpiece with a resin to process into a molded product. As a requirement, the upper mold and the lower mold include any one of configurations below. In a configuration, one of the upper mold and the lower mold is provided with one workpiece holding part that holds a plurality of workpieces, and the other of the upper mold and the lower mold is provided with: a plurality of clampers having structures divided from each other that individually clamp the plurality of workpieces held on the one workpiece holding part; and a cavity piece capable of moving up and down in a manner unlinked with the clamper at a central position in a plan view of each of the plurality of clampers. Alternatively, in a configuration, one of the upper mold and the lower mold is provided with one workpiece holding part that holds one or more workpieces each with a plurality of electronic components mounted on one substrate, and the other of the upper mold and the lower mold is provided with: a plurality of clampers having structures divided from each other that individually clamp the plurality of electronic components in one workpiece; and a cavity piece capable of moving up and down in a manner unlinked with the clamper at a central position in a plan view of each of the plurality of clampers. The sealing mold includes: a clamper spring that biases the clamper toward the workpiece holding part; and a cavity piece spring that biases the cavity piece toward the workpiece holding part.

According to the above, since clamping can be performed on the plurality of workpieces by the divided clampers individually and movably up and down, it becomes possible to absorb the thickness variation of the workpiece, and damage to the workpiece or occurrence of insufficient clamping force can be prevented. Furthermore, since the cavity pieces can be moved up and down individually with respect to the plurality of workpieces, it becomes possible to also absorb the variation in the resin amount.

Further, in the case where there is a step (dimensional difference in thickness) in one substrate, or in the case where there is a dimensional difference in thickness in each of the plurality of electronic components mounted on one substrate, or even in the case where there is variation in the amount of the resin placed on each electronic component, both the dimensional difference and the resin amount variation can be absorbed.

Further, the workpiece clamping force can be set by the clamper spring, and the molding pressure can be set by the cavity piece spring. Accordingly, since the workpiece clamping force and the molding pressure can each be individually set and adjusted, it becomes possible to make fine changes to the sealing conditions for each workpiece (for each product). Furthermore, since the acting force can be completed with setting and adjustments on only one of the molds, it becomes possible to make condition changes very easily.

Further, preferably, the plurality of clampers are configured to be arranged in parallel in a predetermined direction, or are configured to be arranged in a matrix in a horizontal plane. Accordingly, a plurality of clampers and a plurality of cavities may be arranged in parallel or in matrices, and it becomes possible to adjust the workpiece clamping force and the molding pressure for each of the clampers and the cavities. Thus, for example, after prototype production in small quantities, even during mass production deployment with an increased take-up quantity, the built-in settings of the prototype model can be directly transitioned to the mass production model.

Further, preferably, in a plan view, the clamper spring is composed of one spring arranged to be aligned with a center of the cavity piece spring, or is composed of a plurality of springs arranged to surround the cavity piece spring. Accordingly, if composed of one spring with respect to one cavity piece spring, a simple and compact apparatus can be realized. On the other hand, if composed of a plurality of springs in an arrangement surrounding one cavity piece spring, it becomes possible to uniformly clamp relatively large workpieces without causing an imbalance in the acting force (especially the workpiece clamping force), and damage to the workpiece or occurrence of insufficient clamping force can be prevented.

Further, preferably, a clamper support part and a movable pin are further included. The clamper support part supports the clamper. The movable pin penetrates the clamper support part and is arranged movably up and down. A biasing force of the cavity piece spring is transmitted to the cavity piece via the movable pin. Accordingly, it is possible to realize a configuration that biases the clamper by the clamper spring and biases the cavity piece by the cavity piece spring.

Further, preferably, the clamper spring is configured such that a plurality of types of springs with spring constants different from each other are provided, and one that corresponds to resin sealing conditions is selected to be detachably fixed to the other of the upper mold and the lower mold. Further, preferably, the cavity piece spring is configured such that a plurality of types of springs with spring constants different from each other are provided, and one that corresponds to resin sealing conditions is selected to be detachably fixed to the other of the upper mold and the lower mold. Accordingly, it becomes possible to individually and very easily make condition changes to the workpiece clamping force and the molding pressure to obtain an appropriate acting force corresponding to the workpiece, i.e., corresponding to the type of product.

Further, a resin sealing apparatus according to the present invention, as a requirement, includes the sealing mold.

Effect of Invention

According to the present invention, it becomes possible to absorb any of the variation in workpiece thickness, the variation in electronic component thickness, and the variation in resin amount by a simple apparatus configuration, and it becomes possible to improve molding quality. Further, it becomes possible to easily and quickly perform setting of the workpiece clamping force and the molding pressure during resin sealing by adjustment to only any one of the molds, and it becomes possible to improve production efficiency.

DESCRIPTION OF EMBODIMENTS

First Embodiment (Overall Configuration)

Figure 1:
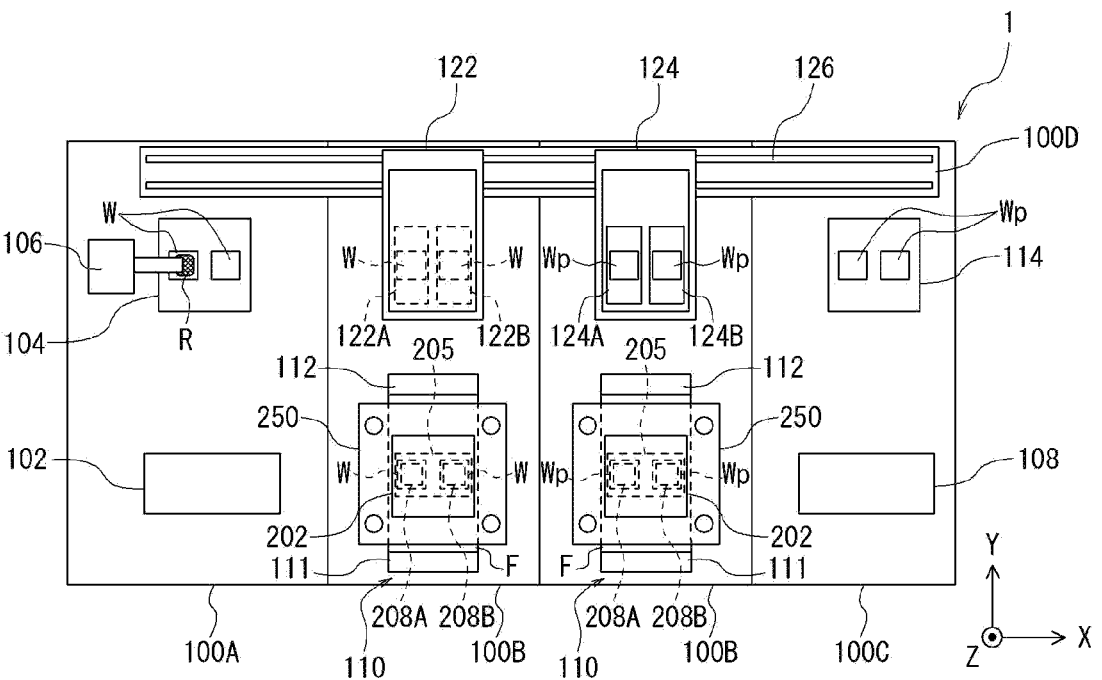
FIG. 1 is a plan view showing an example of a sealing mold and a resin sealing apparatus according to a first embodiment of the present invention.

Hereinafter, referring to the drawings, a first embodiment of the present invention will be described in detail. FIG. 1 is a plan view (schematic view) showing an example of a sealing mold 202 and a resin sealing apparatus 1 including the sealing mold 202 according to this embodiment. For convenience of illustration, in the figure, arrows indicate a left-right direction (X direction), a front-rear direction (Y direction), and an up-down direction (Z direction) in the resin sealing apparatus 1. Further, in all figures for describing each embodiment, the same reference signs are labeled on members having the same functions, and repeated descriptions thereof may be omitted.

The resin sealing apparatus 1 according to this embodiment is an apparatus that resin-seals a workpiece (molded product) W using the sealing mold 202 including an upper mold 204 and a lower mold 206. Hereinafter, as an example, the resin sealing apparatus 1 will be described as a compression molding apparatus that holds a plurality of workpieces W with the lower mold 206, covers a plurality of cavities 208 (including a part of a mold surface 204a) provided in a corresponding arrangement in the upper mold 204 with a release film (hereinafter sometimes simply referred to as a "film") F, performs a clamping operation between the upper mold 204 and the lower mold 206, and seals the plurality of workpieces W collectively with a resin R.

First, the workpiece W, which is the molding target, has a configuration in which a plurality of electronic components Wb are mounted on a substrate Wa in a matrix. More specifically, examples of the substrate Wa include plate-shaped members such as a resin substrate, a ceramic substrate, a metal substrate, a carrier plate, a lead frame, a wafer, etc. formed into a rectangular shape, a circular shapes, etc. Further, examples of the electronic component Wb include a semiconductor chip, a MEMS chip, a passive element, a heat sink, a conductive member, a spacer, etc. However, the embodiment is not limited thereto.

Examples of the method of mounting the electronic components Wb on the substrate Wa include mounting methods performed by wire bonding mounting, flip chip mounting, etc. Alternatively, in the case of a configuration in which the substrate (a carrier plate made of glass or metal) Wa is peeled off from a molded product Wp after resin sealing, there is also a method of attaching the electronic components Wb using an adhesive tape having thermal peeling properties or an ultraviolet-curable resin that cures by ultraviolet irradiation.

On the other hand, examples of the resin R include a thermosetting resin (e.g., an epoxy-based resin or the like containing a filler) in a grain form (used as a general term for a granular form, a crushed form, a powdered form, etc.). The resin R is not limited to the above state but may also be in other states (shapes) such as a liquid form, a plate shape, a sheet shape, etc., and may also be a resin other than an epoxy-based thermosetting resin.

Further, examples of the film F preferably include a film material excellent in heat resistance, peelability, flexibility, and stretchability, such as polytetrafluoroethylene (PTFE), polytetrafluoroethylene polymer (ETFE), PET, FEP, fluorine-impregnated glass cloth, polypropylene, polyvinylidene chloride, etc. In this embodiment, a roll-shaped film is used as the film F. As another example, a strip-shaped film may also be used (not shown).

Next, an overview of the resin sealing apparatus 1 according to this embodiment will be described. As shown in FIG. 1, the resin sealing apparatus 1 includes, as main configurations, a supply unit 100A that mainly performs supply of the workpiece W and the resin R, a press unit 100B that mainly resin-seals the workpiece W to process into a molded product Wp, and a storage unit 100C that mainly performs storage of the molded product Wp after resin sealing.

Further, the resin sealing apparatus 1 includes a transport mechanism 100D that moves between each unit to perform transportation of the workpiece W, the resin R, and the molded product Wp. As an example, the transport mechanism 100D includes a workpiece loader 122 that carries the workpiece W and the resin R into the press unit 100B, a molded product loader 124 that carries the molded product Wp out from the press unit 100B, and a guide rail 126 shared by the workpiece loader 122 and the molded product loader 124. The transport mechanism 100D is not limited to a configuration including loaders, but may also be configured to include a multi-joint robot (not shown).

Herein, the workpiece loader 122 functions to receive the workpiece W (with the resin R placed) in the supply unit 100A and transport the workpiece W to the press unit 100B. As a configuration example, workpiece holding parts 122A and 122B are provided to be arranged side by side in two columns in the X direction and each capable of holding one workpiece W. Conventional holding mechanisms (e.g., a configuration having a holding claw to perform clamping, a configuration having a suction hole communicating with a suction device to perform adsorption, etc.) are used as the workpiece holding parts 122A and 122B (not shown).

The workpiece loader 122 according to this embodiment is configured to move in the X direction and the Y direction to carry the workpiece W (with the resin R placed) into the sealing mold 202 and place the workpiece W to the lower mold 206. However, the embodiment is not limited thereto and may also be configured to separately include a loader that moves in the X direction to perform transportation between units and a loader that moves in the Y direction to perform carry-in to the sealing mold 202 (not shown).

Further, the molded product loader 124 functions to receive the molded product Wp in the press unit 100B and transport the molded product Wp to the storage unit 100C. As a configuration example, molded product holding parts 124A and 124B are provided to be arranged side by side in two columns in the X direction and each capable of holding one molded product Wp. Conventional holding mechanisms (e.g., a configuration having a holding claw to perform clamping, a configuration having a suction hole communicating with a suction device to perform adsorption, etc.) are used as the molded product holding parts 124A and 124B (not shown).

The molded product loader 124 according to this embodiment is configured to move in the X direction and the Y direction to carry the molded product Wp out of the sealing mold 202 and place the molded product Wp to a storage table 114. However, the embodiment is not limited thereto and may also be configured to separately include a loader that moves in the Y direction to perform carry-out from the sealing mold 202 and a loader that moves in the X direction to perform transportation between units (not shown).

The overall configuration of the resin sealing apparatus 1 may be changed by changing the configurations of the units. For example, although the configuration shown in FIG. 1 is an example in which two press units 100B are installed, it is also possible to install only one press unit 100B or install three or more press units 100B. Further, it is also possible to additionally install other units (none is shown).

(Supply Unit)

Next, the supply unit 100A included in the resin sealing apparatus 1 will be described.

The supply unit 100A includes a workpiece stocker 102 used for accommodating the workpiece W. As an example, the workpiece stocker 102 is a conventional stack magazine, a slit magazine etc., and is capable of collectively accommodating a plurality of workpieces W. Herein, the workpiece W taken out from the workpiece stocker 102 is placed on a supply table 104.

Further, the supply unit 100A includes a dispenser 106 that supplies the resin R to the upper surface of the workpiece W placed on the supply table 104. With the resin R placed on the upper surface, the workpiece W is transported to the sealing mold 202 by the workpiece loader 122. However, the embodiment is not limited thereto and may also be configured to include a resin loader that directly carries the resin R into the sealing mold 202 separately from the workpiece W (not shown).

In the supply unit 100A and the like, an inspection mechanism that inspects the appearance of the workpiece W, a workpiece heater that preheats the workpiece W, etc. may be included (none is shown).

(Press Unit)

Figure 2:
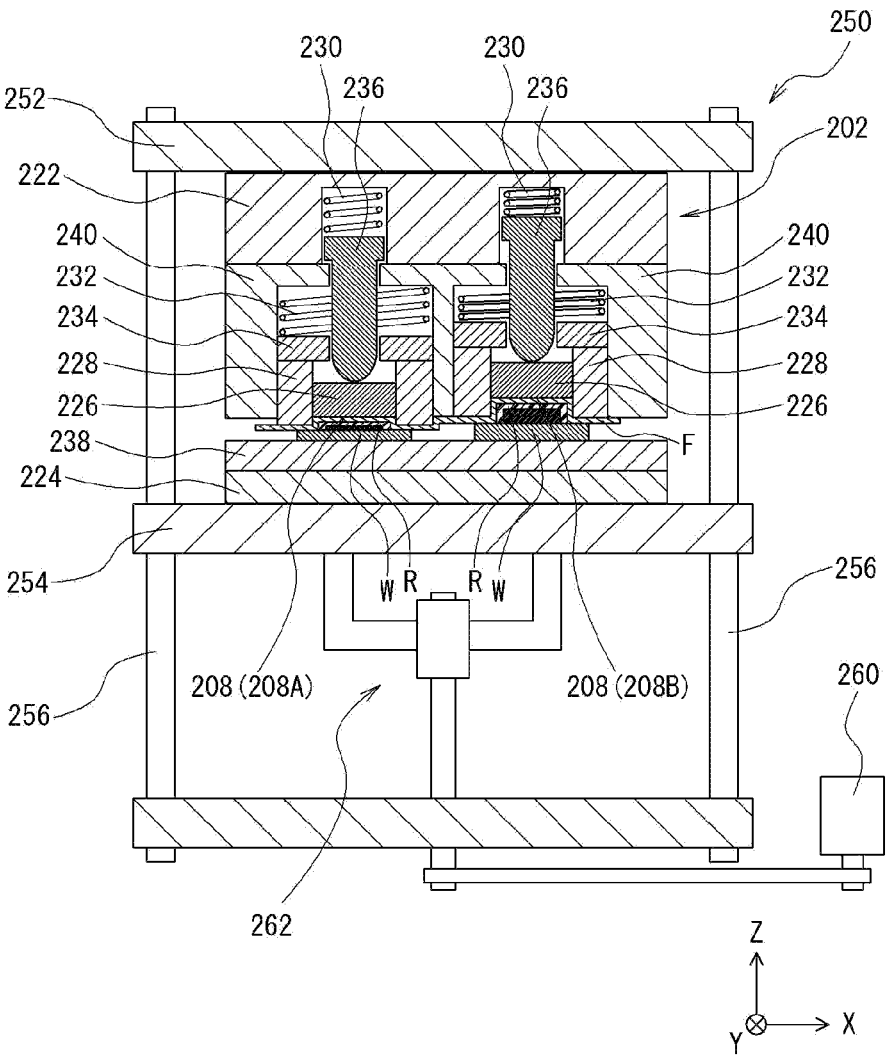
FIG. 2 is a front cross-sectional view showing an example of a mold opening-closing mechanism of the resin sealing apparatus in FIG. 1.
Figure 3:
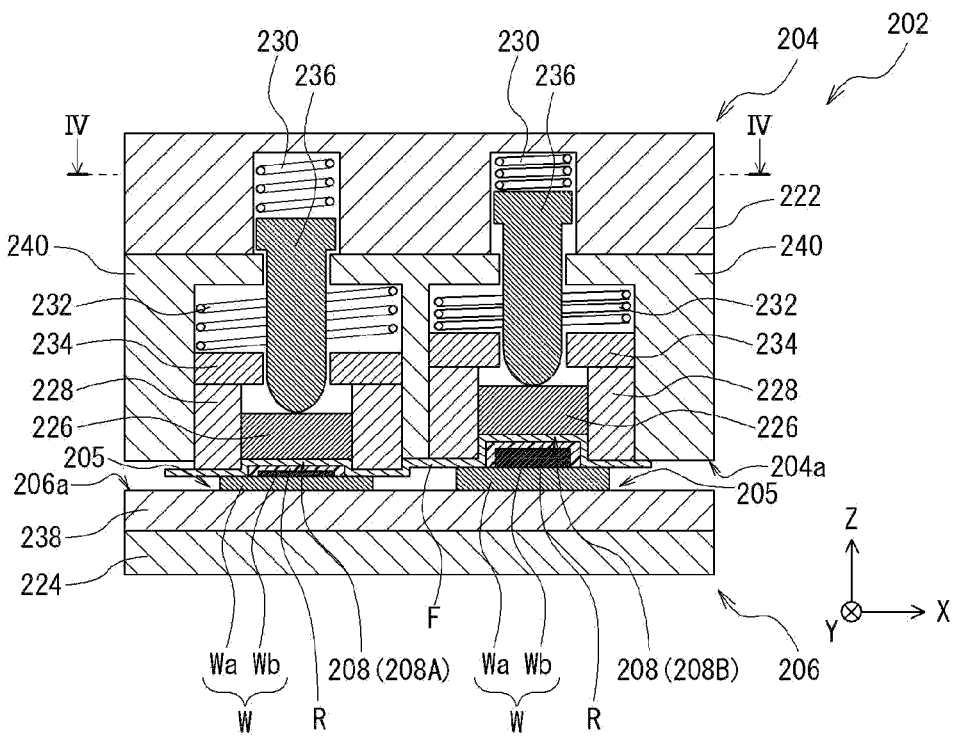
FIG. 3 is a front cross-sectional view showing an example of the sealing mold of the resin sealing apparatus in FIG. 1.

Next, the press unit 100B included in the resin sealing apparatus 1 will be described. Herein, FIG. 2 shows a front cross-sectional view (schematic view) of a mold opening-closing mechanism 250 of the resin sealing apparatus 1. FIG. 3 shows a front cross-sectional view (schematic view) of the sealing mold 202 of the resin sealing apparatus 1.

The press unit 100B includes a sealing mold 202 having a pair of molds (e.g., formed by assembling a plurality of blocks, plates, pillars, and other members together) that open and close. In this embodiment, as the pair of molds, an upper mold 204 on the upper side in the vertical direction and a lower mold 206 on the lower side are included. With the upper mold 204 and the lower mold 206 approaching and separating from each other, mold closing and mold opening are performed. That is, the vertical direction (up-down direction) is the mold opening-closing direction.

Further, mold opening and closing of the sealing mold 202 is performed by a conventional mold opening-closing mechanism 250. As shown in FIG. 2, as an example, the mold opening-closing mechanism 250 is configured to include a pair of platens 252 and 254, a plurality of connecting mechanisms 256 on which the pair of platens 252 and 254 are installed, a drive source (e.g., an electric motor) 260 and a drive transmission mechanism (e.g., a ball screw and a toggle link mechanism) 262 that make the platen 254 movable (rising and lowering), etc.

Herein, the sealing mold 202 is arranged between the pair of platens 252 and 254 in the mold opening-closing mechanism 250. In this embodiment, the upper mold 204 is assembled to a fixed platen (a platen fixed to the connecting mechanism 256) 252, and the lower mold 206 is assembled to a movable platen (a platen that rises and lowers along the connecting mechanism 256) 254. However, the embodiment is not limited to this configuration, and the upper mold 204 may also be assembled to the movable platen and the lower mold 206 may also be assembled to the fixed platen, or both the upper mold 204 and the lower mold 206 may also be assembled to movable platens.

Next, the upper mold 204 of the sealing mold 202 will be described in detail. As shown in FIG. 3, the upper mold 204 includes a plurality of clampers 228 having structures divided from each other that individually clamp a plurality of workpieces W held on one workpiece holding part 205 of the lower mold 206 (to be described later). Further, a cavity piece 226 capable of moving up and down in a manner unlinked with the clamper 228 is provided at the central position in a plan view of each of the plurality of clampers 228. That is, each cavity piece 226 constitutes the inner part (bottom part) of the cavity 208, and each clamper 228 around it constitutes the side part of the cavity 208. Illustration of an exhausting mechanism or a film adsorption mechanism in the cavity 208 is omitted. In this embodiment, two sets of cavities 208 (208A and 208B in FIG. 1) are arranged side by side in a predetermined direction (as an example, the X direction) in one upper mold 204, and two workpieces W are resin-sealed collectively. However, the embodiment is not limited to this configuration and may also be configured to include one set of cavity or three or more sets of cavities (not shown).

Further, the upper mold 204 includes a clamper spring 232 as a biasing member that biases the clamper 228 toward the workpiece holding part 205, and a cavity piece spring 230 as a biasing member that biases the cavity piece 226 toward the workpiece holding part 205. As an example, the clamper 228 is held in a cavity block 240 in a manner capable of moving up and down in a state biased by the clamper spring 232. Further, the cavity piece 226 is held in the clamper 228 in a manner capable of moving up and down in a state biased by the cavity piece spring 230. The workpiece clamping force during resin sealing is set by the clamper spring 232. Further, the molding pressure during resin sealing is set by the cavity piece spring 230.

According to the above configuration, since clamping can be performed on the plurality of workpieces W by the divided clampers 228 individually and movably up and down, it becomes possible to absorb the thickness variation of the workpiece W, and damage to the workpiece W or occurrence of insufficient clamping force can be prevented. Furthermore, since the cavity pieces 226 can be moved up and down individually with respect to the plurality of workpieces W, it becomes possible to also absorb the variation in the amount of the resin R placed on the workpieces W. Further, it is possible to realize a configuration of setting the workpiece clamping force during resin sealing by the clamper spring 232 and setting the molding pressure during resin sealing by the cavity piece spring 230. That is, since each acting force can be individually obtained and individually adjusted, it becomes possible to make fine changes to the sealing conditions for each workpiece W (for each product type). Furthermore, since the acting force can be completed with adjustments on only one mold (as an example, the upper mold 204), it becomes possible to make condition changes very easily.

Figure 4:
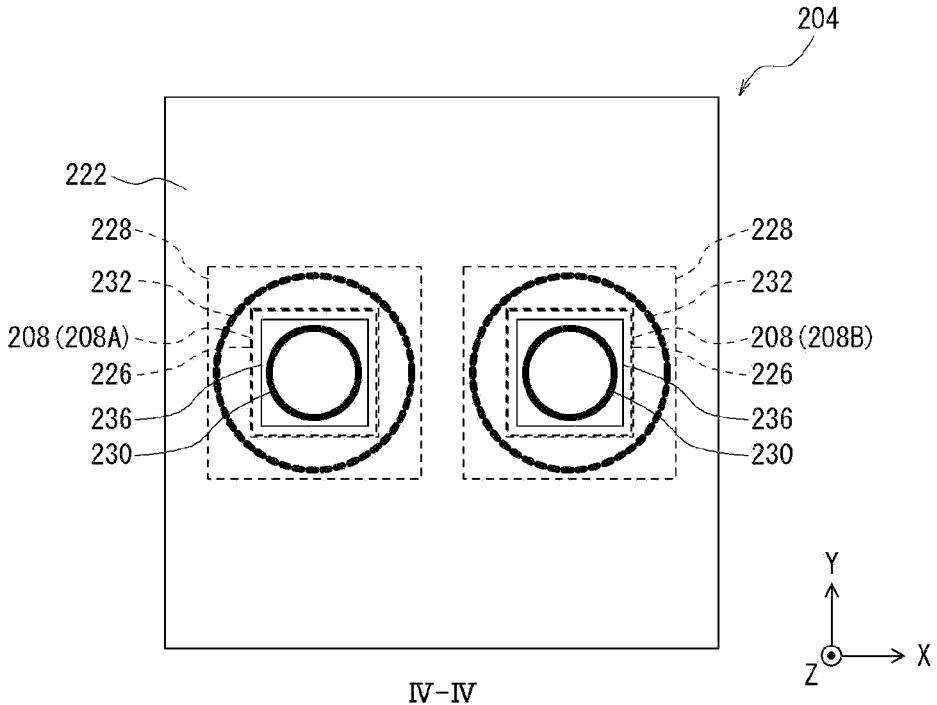
FIG. 4 is a plan view illustrating an example of an upper mold of the resin sealing apparatus in FIG. 1.
Figure 5:
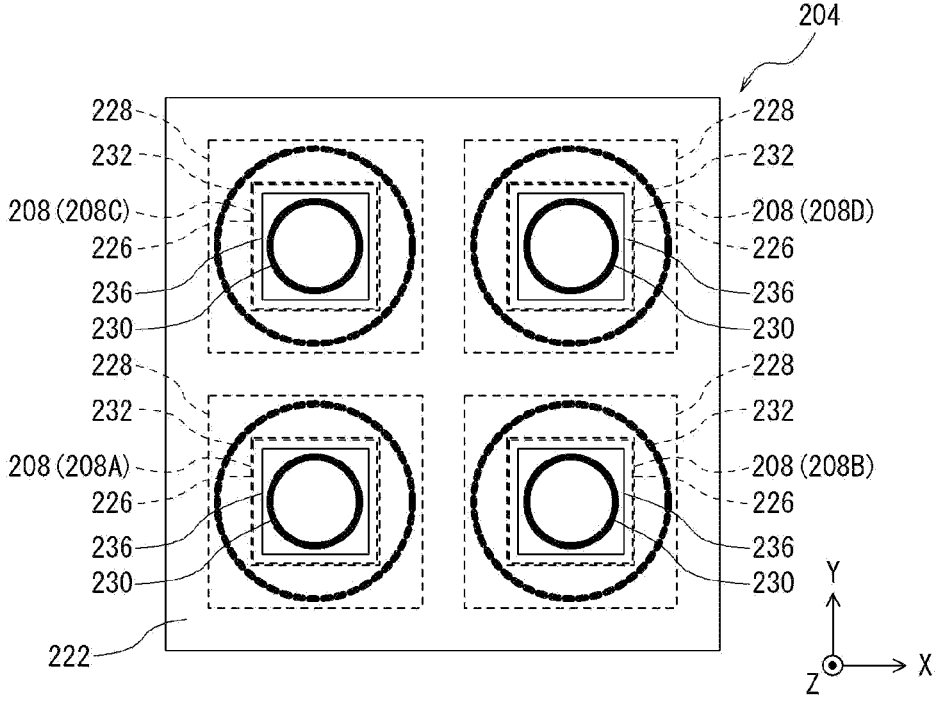
FIG. 5 is a plan view illustrating another example of the upper mold of the resin sealing apparatus in FIG. 1.

As described above, in this embodiment, as shown in the illustrative view of FIG. 4 (cross-sectional view along line IV-IV in FIG. 3), a plurality of sets (as an example, two sets 208A and 208B) of cavities 208 are arranged side by side in the X direction in one upper mold 204, and correspondingly, a plurality (as an example, two) of clampers 228 are arranged in parallel in the X direction. Alternatively, as a modification example, as shown in the illustrative view of FIG. 5 (shown at the same position as FIG. 4), a plurality of sets (as an example, four sets 208A, 208B, 208C, and 208D in two rows by two columns) of cavities 208 may be arranged side by side in a matrix in the X-Y plane in one upper mold 204, and correspondingly, a plurality (as an example, four in two rows by two columns) of clampers 228 may be arranged in a matrix in the X-Y plane. However, the embodiment is not limited to these numbers of sets (quantities).

As described above, in this embodiment, as shown in the illustrative view of FIG. 4 (cross-sectional view along line IV-IV in FIG. 3), a plurality of sets (as an example, two sets 208A and 208B) of cavities 208 are arranged side by side in the X direction in one upper mold 204, and correspondingly, a plurality (as an example, two) of clampers 228 are arranged in parallel in the X direction. Alternatively, as a modification example, as shown in the illustrative view of FIG. 5 (shown at the same position as FIG. 4), a plurality of sets (as an example, four sets 208A, 208B, 208C, and 208D in two rows by two columns) of cavities 208 may be arranged side by side in a matrix in the X-Y plane in one upper mold 204, and correspondingly, a plurality (as an example, four in two rows by two columns) of clampers 228 may be arranged in a matrix in the X-Y plane. However, the embodiment is not limited to these numbers of sets (quantities).

According to the above configuration, a plurality of clampers 228 and a plurality of cavities 208 may be arranged in parallel or in matrices, and it becomes possible to adjust the workpiece clamping force and the molding pressure for each of the clampers 228 and the cavities 208. Thus, for example, after prototype production in small quantities, even during mass production deployment with an increased take-up quantity, the built-in settings of the prototype model can be directly transitioned to the mass production model.

Figure 6A:
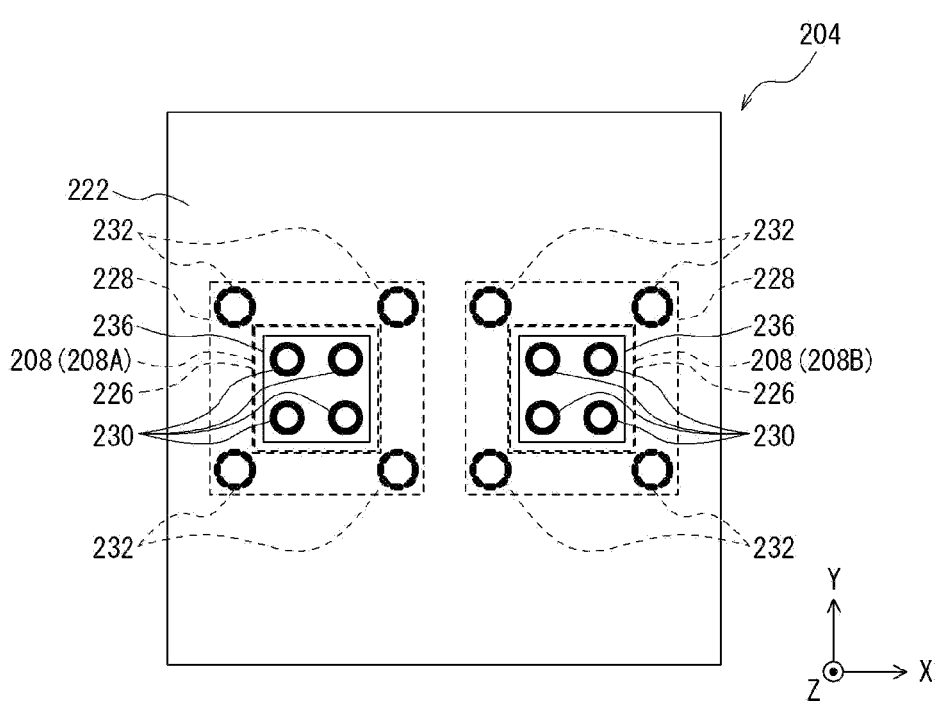
FIG. 6A and FIG. 6B are plan views illustrating other examples of the upper mold of the resin sealing apparatus in FIG. 1.
Figure 6B:
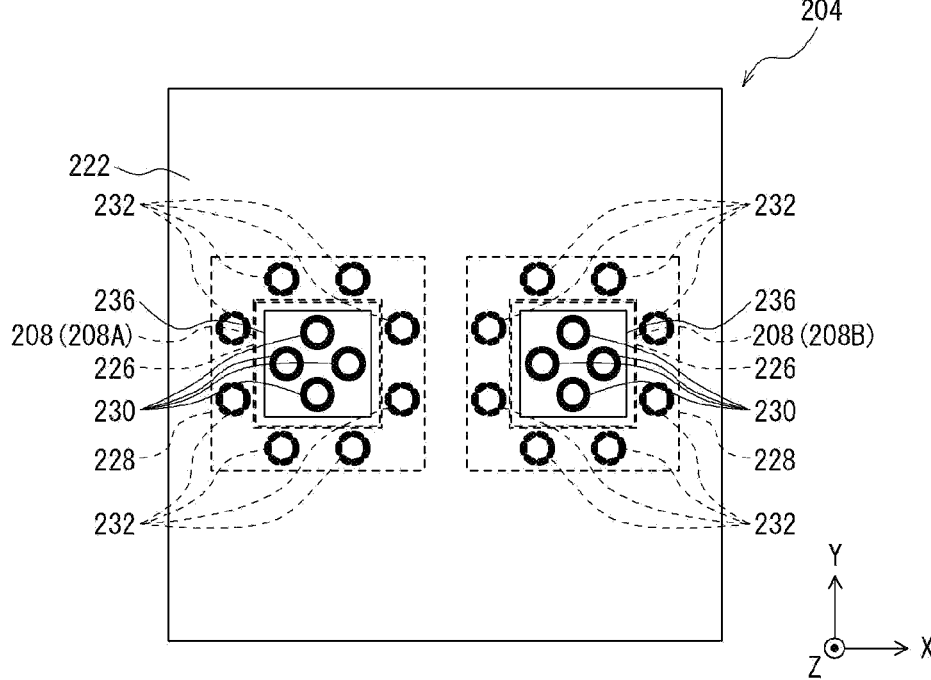

Further, as shown in the illustrative view of FIG. 4, the clamper spring 232 and the cavity piece spring 230 according to this embodiment are each composed of one spring (as an example, a coil spring) arranged with its center aligned with the center of each cavity 208 in a plan view. According to this configuration, a simple and compact apparatus can be realized. Alternatively, as modification examples, as shown in the illustrative views of FIG. 6A and FIG. 6B (shown at the same position as FIG. 4), each may also be composed of a plurality of springs (as an example, coil springs) arranged to surround the center of each cavity 208. In that case, arrangement examples such as those in FIG. 6A and FIG. 6B may be considered. According to this configuration, it becomes possible to uniformly clamp relatively large workpieces W without causing an imbalance in the acting force (especially the workpiece clamping force), and damage to the workpiece W or occurrence of insufficient clamping force can be prevented.

Furthermore, as a characteristic configuration, the upper mold 204 according to this embodiment includes a clamper support part 234 that supports the clamper 228, and a movable pin 236 that penetrates the clamper support part 234 and is arranged to be movable up and down. The biasing force of the cavity piece spring 230 is transmitted to the cavity piece 226 via the movable pin 236. Further, the clamper support part 234 is inserted between the clamper 228 and the clamper spring 232. Accordingly, it is possible to realize a configuration that biases the clamper 228 by the clamper spring 232 and biases the cavity piece 226 by the cavity piece spring 230.

Further, in this embodiment, the clamper spring 232 is configured such that a plurality of types of springs (as an example, coil springs) with spring constants different from each other are provided, and from these types, one that corresponds to the resin sealing conditions is selected and is detachably fixed to the upper mold 204. Accordingly, since the workpiece clamping force can be individually set and adjusted, it becomes possible to make condition changes very easily such that an appropriate workpiece clamping force is obtained for each workpiece W.

Similarly, the cavity piece spring 230 is configured such that a plurality of types of springs (e.g., coil springs) with spring constants different from each other are provided, and from these types, one that corresponds to the resin sealing conditions is selected and is detachably fixed to the upper mold 204. Accordingly, since the molding pressure can be individually set and adjusted, it becomes possible to make condition changes very easily such that an appropriate molding pressure is obtained for each workpiece W.

Further, in this embodiment, an upper mold heating mechanism that heats the upper mold 204 to a predetermined temperature is provided. This upper mold heating mechanism includes a heater (e.g., an electric wire heater), a temperature sensor, a power source, etc., and heating control is performed by a control part (none is shown). As an example, the heater is built in an upper plate 222 and a mold base (not shown) that accommodates them, and is configured to mainly apply heat to the entire upper mold 204 and the resin R (to be described later). Accordingly, the upper mold 204 is adjusted and heated to a predetermined temperature (e.g., 100° C. to 200° C.).

Further, in this embodiment, a film supply mechanism 110 is provided to transport (supply) a film F in a roll shape without openings (holes) on the sheet surface to inside the sealing mold 202. This film supply mechanism 110 is configured such that an unused film F is fed out from an unwinding part 111 and supplied to the opened sealing mold 202, and, after being used for resin sealing in the sealing mold 202, is wound up as a used film F by a winding part 112. The unwinding part 111 and the winding part 112 may also be arranged reversely in the Y direction, or may also be arranged to supply one strip of the film F in the X direction (both not shown). Further, as described above, a strip-shaped film may also be used instead of the roll-shaped film (not shown).

Next, the lower mold 206 of the sealing mold 202 will be described in detail. As shown in FIG. 3, the lower mold 206 includes a lower plate 224, a holding plate 238, etc. and is configured by assembling these parts. Herein, the holding plate 238 is fixedly assembled to the upper surface (the surface on the upper mold 204 side) of the lower plate 224.

Further, in this embodiment, one workpiece holding part 205 that holds a plurality of workpieces W at predetermined positions on the upper surface of the holding plate 238 is provided on one lower mold 206 (a configuration (not shown) with a plurality of workpiece holding parts 205 may also be adopted). In this workpiece holding part 205, a suction path that penetrates the holding plate 238 and the lower plate 224 to communicate with a suction device is provided as a mechanism that holds the workpiece W (not shown). Accordingly, it becomes possible to adsorb and hold the workpiece W to a mold surface 206a (herein, the upper surface of the holding plate 238). As a modification example, instead of or in addition to the adsorption mechanism described above, a holding claw that clamps the outer circumference of the workpiece W may also be included (not shown).

Herein, in this embodiment, corresponding to the configuration of one upper mold 204 shown in FIG. 4 described above, that is, the configuration in which a plurality of sets (as an example, two sets) of cavities 208 are arranged side by side in the X direction (208A and 208B in FIG. 4), one workpiece holding part 205 capable of holding a plurality (as an example, two) of workpieces W is provided on one lower mold 206 (see FIG. 1). Alternatively, as a modification example, corresponding to the configuration of one upper mold 204 shown in FIG. 5, that is, the configuration in which a plurality of sets (as an example, four sets) of cavities 208 are arranged side by side in a matrix in the X-Y plane (208A, 208B, 208C, and 208D in FIG. 5), one workpiece holding part 205 capable of holding a plurality (as an example, four in two rows by two columns) of workpieces W is provided on one lower mold 206 (not shown). The embodiment is not limited to the above configuration and may also be configured to be provided with a plurality of workpiece holding parts capable of holding a plurality of workpieces W (not shown).

Further, in this embodiment, a lower mold heating mechanism that heats the lower mold 206 to a predetermined temperature is provided. This lower mold heating mechanism includes a heater (e.g., an electric wire heater), a temperature sensor, a power source, etc., and heating control is performed by a control part (none is shown). As an example, the heater is built in the lower plate 224 and a mold base (not shown) that accommodates them, and is configured to mainly apply heat to the entire lower mold 206 and the workpiece W. Accordingly, the lower mold 206 is adjusted and heated to a predetermined temperature (e.g., 100° C. to 200° C.).

As described above, according to the sealing mold 202 related to this embodiment, "multi-row take-up molding" can be realized, that is, a take-up quantity of the molded product Wp per set of the sealing mold 202 can be set to a plurality (as an example, two, four, etc.). Thus, compared to conventional apparatuses in which the take-up quantity of the molded product is one, since the number of times of supply of materials (the workpiece W, the resin R, and the film F) to the sealing mold 202 can be reduced, productivity can be improved. Further, since the number of times of press (that is, the number of times of performance of the resin sealing process) can be reduced, the manufacturing costs can be reduced. Further, reductions in the apparatus costs resulting from miniaturization of the entire apparatus and simplification of configuration can be achieved.

(Molded Product Storage Unit)

Next, the storage unit 100C included in the resin sealing apparatus 1 will be described.

The storage unit 100C includes a molded product stocker 108 used for accommodating the molded products Wp. As an example, the molded product stocker 108 is a conventional stack magazine, a slit magazine, etc. and is capable of collectively accommodating a plurality of molded products Wp. Herein, the molded products Wp are transported by the molded product loader 124, is temporarily placed on the storage table 114, and then is carried into the molded product stocker 108.

In the storage unit 100C and the like, an inspection mechanism that inspects the appearance of the molded product Wp may be included (not shown).

(Resin Sealing Operation)

Next, the operation of performing resin sealing using the sealing mold 202 and the resin sealing apparatus 1 including the sealing mold 202 according to this embodiment will be described. Herein, a configuration will be provided as an example: two sets of cavities 208 are provided in one upper mold 204, two workpieces W (e.g., strip-shaped workpieces) are arranged in parallel on one lower mold 206 to perform resin sealing collectively, and two molded products Wp are obtained at the same time. However, the embodiment is not limited to this configuration, and one workpiece W may be arranged or three or more workpieces W may be arranged in parallel, or a plurality of workpieces W may be arranged in a matrix, to perform resin sealing.

As a preparation process, a heating process (upper mold heating process) is performed to adjust and heat the upper mold 204 to a predetermined temperature (e.g., 100° C. to 200° C.) by the upper mold heating mechanism. Further, a heating process (lower mold heating process) is performed to adjust and heat the lower mold 206 to a predetermined temperature (e.g., 100° C. to 200° C.) by the lower mold heating mechanism. Furthermore, a process (film supply process) is performed to transport (feed out), by the film supply mechanism 110, a film F from the unwinding part 111 to the winding part 112 to supply the film F to a predetermined position (a position between the upper mold 204 and the lower mold 206) in the sealing mold 202.

Next, a process is performed to carry, by a conventional pusher or the like (not shown), the workpieces W one by one out of the workpiece stocker 102 and place onto the supply table 104 (a conventional pickup mechanism or the like may also be used together).

Next, a process is performed to supply and place a predetermined amount of the resin R from the dispenser 106 onto the upper surfaces of the workpieces W placed on the supply table 104. In this process, a process of preheating the resin R at a temperature that does not cure the resin R may also be performed.

Next, a process is performed to transport, by the workpiece loader 122, a plurality (as an example, two) of workpieces W (each with the resin R placed on the upper surface) in one-time process into the sealing mold 202 of the press unit 100B, and place the plurality of workpieces W on one workpiece holding part 205 of one lower mold 206. In this process, a process (preheating process) of preheating the workpieces W by a heater provided in the workpiece loader 122 is performed. The preheating process may also be omitted.

Next, mold closing of the sealing mold 202 is performed, and a process (resin sealing process) of clamping the workpieces W by the upper mold 204 and the lower mold 206 to resin-seal the workpieces W is performed. At this time, in the cavities 208, the cavity pieces 226 relatively lower to heat and pressurize the resin R against the workpieces W. Accordingly, the resin R is thermally cured to perform resin sealing (compression molding), and molded products Wp are formed.

Next, mold opening of the sealing mold 202 is performed, and a process of taking, by the molded product loader 124, the molded products Wp out from the sealing mold 202 is performed. In this process, a process (post-molding heating process) may be performed to heat the taken molded products Wp by a heater provided in the molded product loader 124.

In parallel with the above (or thereafter), a process is performed to feed out, by the film supply mechanism 110, the used film F by transporting the film F from the unwinding part 111 to the winding part 112.

Next, a process is performed to place the molded products Wp onto the storage table 114 by the molded product loader 124 (a conventional pickup mechanism or the like may be used together). Then, a process is performed to carry the molded products Wp one by one into the molded product stocker 108 by a conventional pusher or the like (not shown). Before these processes, a process of performing post-curing of the molded products Wp may also be performed.

The above are the main operations of resin sealing performed using the resin sealing apparatus 1. However, the above process sequence is an example, and a change in sequence or parallel performance is also possible as long as hindrance does not occur. For example, in this embodiment, since two press units 100B are included, efficient formation of molded products becomes possible by performing the above operations in parallel.

Second Embodiment

Figure 7:
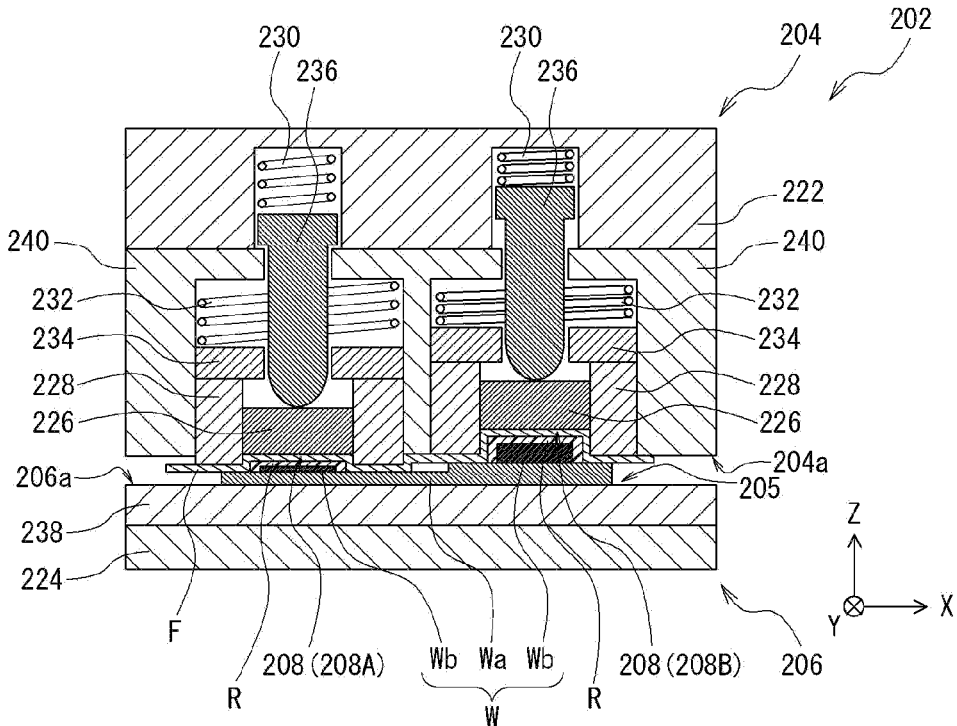
FIG. 7 is a front cross-sectional view showing an example of a sealing mold according to a second embodiment of the present invention.

Next, a second embodiment of the present invention will be described. Compared to the first embodiment described above, this embodiment includes a configuration for corresponding to a workpiece W of a different configuration. Hereinafter, the differences will be mainly described. Herein, FIG. 7 shows a front cross-sectional view (schematic view) of a sealing mold 202 according to the second embodiment.

In this embodiment, the workpiece W serving as the molding target is characterized by including a configuration in which a plurality of electronic components Wb are mounted on one substrate Wa. Thus, the workpiece holding part 205 includes a configuration that holds one such workpiece W. The workpiece holding part 205 may also be configured to hold a plurality of such workpieces W (not shown).

Along with this, the clamper 228 includes a configuration provided with a plurality of structures divided from each other that individually clamp a plurality of electronic components Wb in one workpiece W.

According to the above configuration, the plurality of electronic components Wb can be clamped by the divided clampers 228 individually and movably up and down. Thus, in the case where there is a step (dimensional difference in thickness) in one substrate Wa, or in the case where there is a dimensional difference in thickness in each of the plurality of electronic components Wb mounted on one substrate Wa, or even in the case where there is variation in the amount of the resin R placed on each electronic component Wb, since both the dimensional difference and the resin amount variation can be absorbed, it becomes possible to perform resin sealing in an appropriate clamping state.

Other configurations according to this embodiment are similar to those of the first embodiment described above, and repeated descriptions will be omitted.

As described above, according to the sealing mold and the resin sealing apparatus including the sealing mold according to the present invention, it becomes possible to absorb any of the variation in workpiece thickness, the variation in electronic component thickness, and the variation in resin amount by a simple apparatus configuration. Thus, it becomes possible to prevent issues such as damage to thick workpieces and insufficient clamping force for thin workpieces and improve molding quality. Further, it becomes possible to easily and quickly perform setting of the workpiece clamping force and the molding pressure during resin sealing by adjustment to only any one of the molds, and it becomes possible to improve production efficiency.

The present invention is not limited to the above embodiments and may be variously modified within the scope without departing from the present invention. In particular, although a scaling mold including cavities in the upper mold and a compression molding apparatus including the sealing mold have been described as an example, the present invention may also be applied to a sealing mold including cavities in the lower mold and a compression molding apparatus including the scaling mold.

The invention claimed is:

1. A sealing mold that seals a workpiece, in which an electronic component is mounted on a substrate, with a resin to process into a molded product, the sealing mold comprising:

a first mold, comprising a workpiece holding part that holds the workpiece; and a second mold, comprising:

a plurality of clampers having structures divided from each other that individually clamp the workpiece held on the workpiece holding part;

a cavity piece capable of moving up and down in a manner unlinked with a respective one of the plurality of clampers at a central position in a plan view of the respective one of the plurality of clampers;

a clamper spring that biases the respective one of the plurality of clampers toward the workpiece holding part;

a cavity piece spring that biases the cavity piece toward the workpiece holding part; and a cavity block provided with: an internal space accommodating the respective one of the plurality of clampers, the cavity piece, and the clamper spring; and a spacing part spacing a clamper support part for each electronic component.

2. The sealing mold according to claim 1, wherein the plurality of clampers are configured to be arranged in parallel in a predetermined direction, or are configured to be arranged in a matrix in a horizontal plane.

3. The sealing mold according to claim 1, wherein in a plan view, the clamper spring is composed of one spring arranged to be aligned with a center of the cavity piece spring, or is composed of a plurality of springs arranged to surround the cavity piece spring.

4. The sealing mold according to claim 1, wherein the second mold further comprises a movable pin that penetrates the cavity block to communicate with the internal space, and a biasing force of the cavity piece spring is transmitted to the cavity piece via the movable pin.

5. The sealing mold according to claim 1, wherein a workpiece clamping force during resin sealing is set by the clamper spring, and a molding pressure during resin sealing is set by the cavity piece spring.

6. The sealing mold according to claim 5, wherein the clamper spring is selected from a plurality of types of springs with spring constants different from each other according to resin sealing conditions, and then is detachably fixed to the second mold.

7. The sealing mold according to claim 5, wherein the cavity piece spring is selected from a plurality of types of springs with spring constants different from each other according to resin sealing conditions, and then is detachably fixed to the second mold.

8. The sealing mold according to claim 1, wherein the second mold further comprises a plate that is connected to the cavity block and accommodates the cavity piece spring.

9. A resin sealing apparatus comprising the sealing mold according to claim 1.

* * * * *